(12) United States Patent
Snyder et al.

(10) Patent No.: US 6,646,346 B1
(45) Date of Patent: Nov. 11, 2003

(54) INTEGRATED CIRCUIT METALLIZATION USING A TITANIUM/ALUMINUM ALLOY

(75) Inventors: Ricky D. Snyder, Fort Collins, CO (US); Robert G Long, Fort Collins, CO (US); David W Hula, Fort Collins, CO (US); Mark D. Crook, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/698,459

(22) Filed: Oct. 27, 2000

(51) Int. Cl.[7] .......................... H01L 23/48; H01L 23/52; H01L 29/40
(52) U.S. Cl. ...................... 257/750; 257/764; 257/765; 257/771
(58) Field of Search .................. 257/678, 750, 257/751, 763, 764, 765, 771, 513, 617, 437; 438/688, 685, 648, 656, 642, 652

(56) References Cited

U.S. PATENT DOCUMENTS

| | | | | |
|---|---|---|---|---|
| 4,995,049 A | * | 2/1991 | Kahen et al. ............... | 257/513 |
| 5,700,718 A | * | 12/1997 | McTeer ...................... | 438/642 |
| 5,747,879 A | * | 5/1998 | Rastogi et al. .............. | 257/751 |
| 5,838,052 A | * | 11/1998 | McTeer ...................... | 257/437 |

OTHER PUBLICATIONS

Marwick, A.D., et al., "Hydrogen redistribution and gettering in A1CU/Ti thin films" in Journal Of Applied Physics, vol. 69, No. 11, Jun. 1, 1991, pp. 7921–7923.

Yoshimaru, M., et al., "Deoxidation of Water Desorbed from APCVD TEOS–$O_3$ $SiO_2$ by Titanium Cap Layer" in Proceedings of the 1995 IEEE International Reliability Physics Symposium, pp. 359–364.

* cited by examiner

*Primary Examiner*—Phat X. Cao
*Assistant Examiner*—Theresa T. Doan
(74) *Attorney, Agent, or Firm*—Kyle J. Way

(57) ABSTRACT

An integrated circuit metallization structure using a titanium/aluminum alloy, and a method to generate such a structure, provide reduced leakage current by allowing mobile impurities such as water, oxygen, and hydrogen to passivate structural defects in the silicon layer of the IC. The titanium layer of the structure is at least partially alloyed with the aluminum layer, thereby restricting the ability of the titanium to getter the mobile impurities within the various layers of the IC. Despite the alloying of the titanium and aluminum, the metallization structure exhibits the superior contact resistance and electromigration properties associated with titanium.

5 Claims, 3 Drawing Sheets

INTEGRATED CIRCUIT METALLIZATION USING A TITANIUM/ALUMINUM ALLOY

BACKGROUND OF THE INVENTION

In the field of integrated circuit (IC) technology, the area of interconnect metallization has received a great deal of attention from researchers and developers over the years due to its importance within the overall IC physical structure. Although the metallization layers of an IC are used primarily to connect various circuit elements within the IC silicon, the metallization also has a direct impact on attainable device geometry, defect density, and leakage current, making IC metallization a critical area of study.

As an example, the metallization of an IC influences the density of mobile impurities within the silicon and dielectric layers that surround the interconnections.

For example, researchers have identified several metallic substances that are useful as "gettering" materials, which are capable of trapping various mobile impurities in the silicon and dielectric layers of an IC. Generally speaking, gettering is a desirable process within an integrated circuit, mitigating the effects of mobile impurities that are commonly introduced during the IC fabrication process. The effects of such impurities include decreased device performance, reliability, and processing yield, among others. In general, gettering reduces these effects by restricting the movement of the mobile impurities, thus improving overall IC performance.

However, some cases exist in which too much gettering is possible; in other words, the presence of some particular types of mobile impurities, in moderate quantities, are actually beneficial to the performance of an integrated circuit. For example, it has been shown in the art that titanium is beneficial as a component of IC metallization for several reasons. As a gettering substance, titanium traps water, hydrogen, and oxygen, thus allowing these substances to be absorbed readily from within the silicon and dielectric layers of an IC. The gettering properties of titanium are discussed, for example, in Marwick, A. D., et al., "Hydrogen redistribution and gettering in AlCu/Ti thin films" in *Journal of Applied Physics*, Vol. 69, No. 11,1 June 1991, pp. 7921–23, and Yoshimaru, M., et al., "Deoxidation of Water Desorbed from APCVD TEOS-$O_3$ $SiO_2$ by Titanium Cap Layer" in *Proceedings of the 1995 IEEE International Reliability Physics Symposium*, pp. 359–64. Additionally, titanium exhibits low contact resistance and helps improve electromigration properties in aluminum. In some circumstances, unfortunately, the gettering effect produced by titanium causes too many water molecules, and the hydrogen and oxygen that combine to form the water, to be absorbed within the titanium. For instance, water and its constituent elements are useful under certain conditions for passivating structural defects within silicon by bonding with the defect sites, thus causing the IC to function more efficiently. In that case, substantial gettering of hydrogen and oxygen may actually be a detriment to the performance characteristics of the IC, resulting in increased leakage current and other impediments to optimal device performance.

Therefore, in many cases it would be advantageous to construct a metallization structure that utilizes the positive qualities of titanium, such as mitigation of electromigration effects and low contact resistance, while at the same time restricting the gettering effect of the titanium so that water, hydrogen, and oxygen will be available to passivate structural defects in the silicon layer of the device.

SUMMARY OF THE INVENTION

Specific embodiments according to the present invention, to be described herein, provide a useful way for titanium to be utilized in a metallization structure of an integrated circuit. The proposed structure takes advantage of the desirable electromigration and contact resistance properties of the titanium, while at the same time limiting its gettering capabilities. Consequently, a sufficient amount of mobile impurities, such as water (and the hydrogen and oxygen it comprises), are then available to passivate structural defects in the silicon layer of the IC.

A method embodiment of the invention begins with the deposition of a layer of titanium onto a preexisting layer of an integrated circuit during fabrication of the IC. A layer of aluminum is then deposited directly onto the titanium layer. During heating of the IC that normally occurs in subsequent fabrication process steps, at least a portion of the titanium alloys with the aluminum layer. The advantage of alloying the aluminum and titanium is that the gettering capacity of the titanium is restricted, thus allowing mobile impurities such as water, hydrogen, and oxygen to be available to passivate structural defects with the silicon of the IC. At the same time, titanium still helps set the structural texture of the aluminum layer, providing low contact resistance and improved electromigration properties.

Another embodiment of the invention describes a metallization structure as it resides on a preexisting layer of the IC after the fabrication of the IC. A layer of titanium resides on the preexisting layer. A layer of aluminum then resides on top of the titanium, with the titanium layer being at least partially alloyed with the aluminum layer. Consequently, the portion of titanium that is alloyed with the aluminum is no longer available as a gettering species, while still providing the desirable electromigration and contact resistance properties normally associated with titanium.

Other aspects and advantages of the invention will become apparent from the following detailed description, taken in conjunction with the accompanying drawings, illustrating by way of example the principles of the invention.

DETAILED DESCRIPTION

Figure 1:
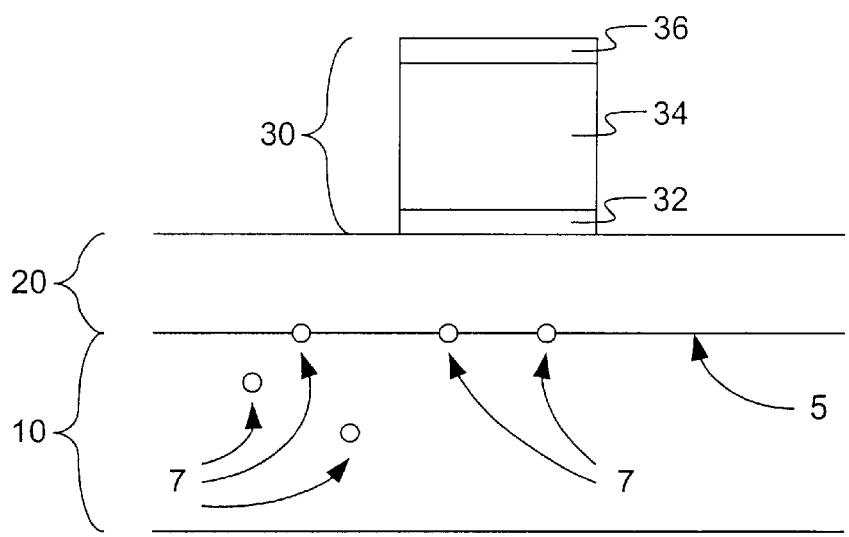
FIG. 1 is an idealized cross-sectional view of an integrated circuit metallization structure according to an embodiment of the invention after deposition of the metal layers.

A cross-sectional view of an integrated circuit during fabrication immediately after metal layer deposition is shown in FIG. 1. The integrated circuit may be of any type contemplated, including, but not limited to, an application-specific integrated circuit (ASIC), a microprocessor, an analog IC, an optoelectronic IC, and so on. For the embodiment of FIG. 1, the structural basis for all layers deposited on the integrated circuit is a silicon layer 10, which in the general case is a standard silicon wafer. Silicon layer 10 has a top silicon surface 5, upon which other layers of the IC are deposited. As is widely known, semiconductor devices (not shown) that make up the various electronic elements of the integrated circuit reside primarily in or on silicon layer 10. Also shown in FIG. 1 are structural defects 7, which reside at top silicon surface 5 of silicon layer 10, as well as within silicon layer 10. Structural defects 7 result from normal wafer fabrication processes. Atop silicon layer 10 is deposited a first dielectric layer 20, which in most cases is a layer of silicon dioxide.

A metallization structure 30 is then deposited over first dielectric layer 20, which provides electrical insulation between metallization structure 30 and silicon layer 10.

Metallization structure 30 is actually made up of many wires, or "traces," of which one is shown in FIG. 1 for the sake of simplicity. Electrical contacts (also not shown) made of metal exist at predefined places within first dielectric layer 20 to allow interconnection of the semiconductor circuit components within silicon layer 10 by way of metallization structure 30.

According to the embodiment of FIG. 1, metallization structure 30 is made up of three separate metal layers at the time of deposition. A titanium layer 32 is deposited first on dielectric layer 20, followed by an aluminum layer 34, and finally by a titanium-nitride layer 36. Titanium-nitride layer 36 is used in this embodiment as a top cladding layer to provide some electromigration protection and to serve as an anit-reflection coating to aid in patterning. Other embodiments may not use a top cladding layer or layers at all. Still others will use alternate materials, including, but not limited to, titanium-tungsten, titanium-tungsten-nitride, tungsten, tungsten-nitride, tantalum, tantalum-nitride, and molybdenum. The existence of titanium layer 32 as deposited on dielectric layer 20 provides for improved contact resistance when used to connect circuit components of silicon layer 10 with metallization structure 30 when compared with the contact resistance of other metallic substances, such as titanium-nitride and titanium-tungsten. Also, titanium layer 32 improves the electromigration properties of aluminum layer 34. In other words, aluminum layer 34 develops fewer cracks in its lattice structure as a result of electrical current through the metal. Such cracks ultimately can cause open circuit connections within the metallization layers of an IC.

As stated earlier, titanium also acts as a gettering species by binding with mobile impurities within the integrated circuit, thereby rendering the impurities ineffective as charge carriers. While this effect is sometimes beneficial within an IC, there are specific instances when gettering is not desirable. For example, the impurities gettered by titanium include water and its constituent elements, hydrogen and oxygen; in other words, titanium removes water, hydrogen, and oxygen from the surrounding areas of the IC. However, water, hydrogen, and oxygen, which are normally present during the IC fabrication process, are useful agents in passivating structural defects 7. The passivating agents bind with the dangling bonds of structural defects 7, thereby inhibiting the ability of the dangling bonds to provide a path for leakage current within silicon layer 10. Leakage current generally occurs in semiconductor circuits in places when little or no current is expected or desired, such as into the gate of a MOSFET, or through the channel of a MOSFET when biased in the "OFF" state.

Another example of unwanted leakage current is the "dark current" associated with a photodiode within an optoelectronic IC. In that case, the photodiode should generate a miniscule amount of current under dark conditions. However, the presence of defects on the top surface of the silicon will cause a higher-than-expected dark current, which would indicate the presence of light incident on the photodiode when, in fact, there is none. In situations such as these, passivation of structural defects 7 would improve the functionality of the circuit significantly. Metalization structure 30, according to embodiments of the present invention, provides this ability.

Figure 2:
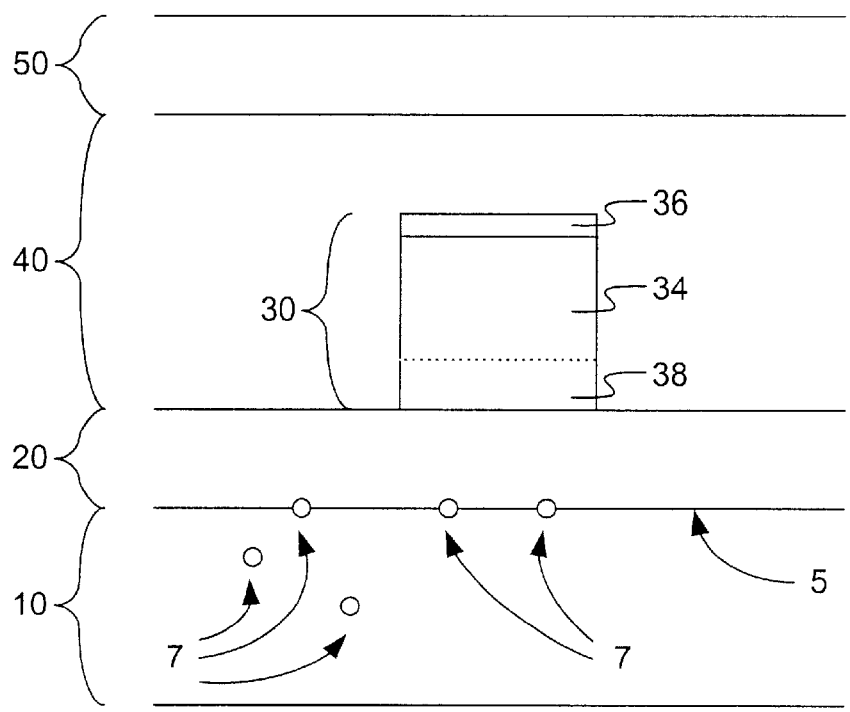
FIG. 2 is an idealized cross-sectional view of an integrated circuit metallization structure according to an embodiment of the invention after oxide and passivation layer deposition.

FIG. 2 displays the cross-section of the same portion of the integrated circuit as shown in FIG. 1, but after a second dielectric layer 40 and a passivation layer 50 have been deposited. Second dielectric layer 40, which typically is silicon dioxide, serves to electrically isolate portions of metallization structure 30 from any subsequent layers deposited on the IC. Afterwards, passivation layer 50 is added to provide overall protection to the IC during the remainder of the IC fabrication process. Passivation layer 50 also acts as a barrier that traps water, hydrogen, and oxygen within the IC. In the embodiment presented in FIG. 1, FIG. 2, and FIG. 3, only one metallization layer is implemented. However, two or more layers are formed in the typical integrated circuit. In those embodiments, metallization structure 30 would be utilized for each metallization layer with the IC.

During the deposition and other processing for second dielectric layer 40 and passivation layer 50, metallization structure 30 is heated sufficiently to cause at least partial alloying of titanium layer 32 (from FIG. 1) and aluminum layer 34, thereby creating titanium-aluminum alloy layer 38.

The embodiment of FIG. 2 exemplifies the case in which the entirety of titanium layer 32 is alloyed into aluminum layer 34, thereby not leaving any "pure" titanium remaining in metallization structure 30. Such a condition is desirable in the case of the optoelectronic IC mentioned above. The presence of any pure titanium in metallization structure 30 would allow at least some partial gettering of water and the associated hydrogen and oxygen. As a result, the number of mobile impurities available to passivate the defects at top silicon surface 5 of silicon layer 10 would be reduced, and the dark current of the photodiodes would increase. According to tests performed using metallization structure 30 in an optoelectronic IC, titanium layer 32 with a thickness of less than or equal to approximately 200 angstroms can be completed alloyed with aluminum layer 34. However, other manufacturing processes may allow thicknesses of greater than 200 angstroms for titanium layer 32 to be completely alloyed with aluminum layer 34, resulting in the same passivation effects noted for the above-mentioned optoelectronic IC.

In other embodiments, more gettering may be desirable; under those circumstances, titanium layer 32 may be made thicker so that only partial alloying of titanium layer 32 with aluminum layer 34 occurs, thus leaving a portion of titanium layer 32 to remain within metallization structure 30. In such a case, gettering of water and its constituent elements is gained at the cost of reduced passivation of structural defects 7 at top silicon surface 5 of silicon layer 10, as well as within silicon layer 10.

Figure 3:
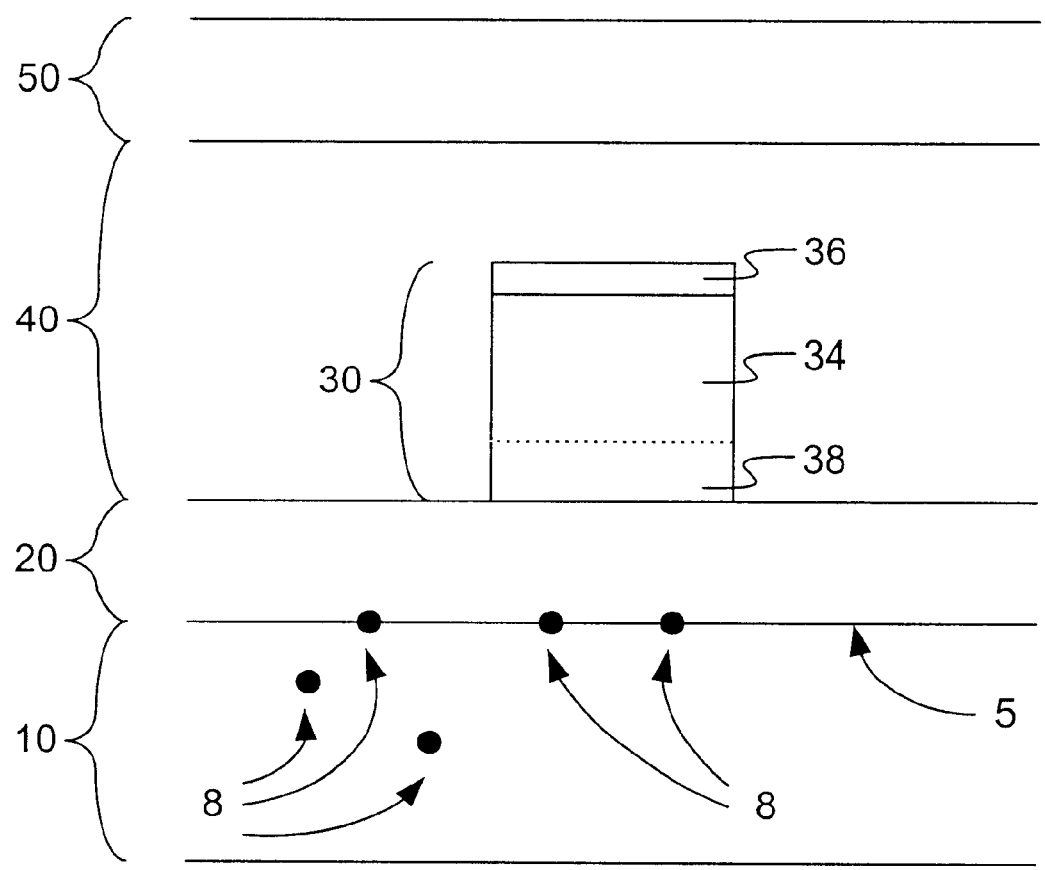
FIG. 3 is an idealized cross-sectional view of an integrated circuit metallization structure according to an embodiment of the invention after final annealing.

FIG. 3 is an idealized cross-sectional view of the integrated circuit after a final annealing step has been completed. During final anneal, the IC is heated to a high temperature, with that temperature being maintained for an extended period of time. The final annealing allows the water, hydrogen, and oxygen within first dielectric layer 20 and second dielectric layer 40 to diffuse rapidly to silicon layer 10, where structural defects 7 (of FIG. 2) reside. The hydrogen and oxygen then come in contact with structural defects 7, bonding with their associated dangling bonds, thereby converting structural defects 7 to passivated structural defects 8, which do not contribute to the deleterious effects earlier attributed to structural defects 7. As a result, effects such as leakage current (or, for optoelectronic ICs, dark current) are reduced since passivated structural defects 8 do not possess the dangling chemical bonds necessary to provide a conductive path for leakage current. Tests conducted for metallization structure 30 utilized a final annealing phase at 400 degrees C. for about 45 minutes, which was sufficient to allow substantial defect passivation. This final annealing also served to ensure complete alloying of a 200 angstrom titanium layer in the case that the titanium had not been completely alloyed with the aluminum by that point in the manufacturing process. Other combinations of temperature and heating time period may be utilized as long as the water, hydrogen, and oxygen of first and second dielectric layers 20 and 40 are able to diffuse through those layers sufficiently to bond with structural defects 7.

Figure 4:
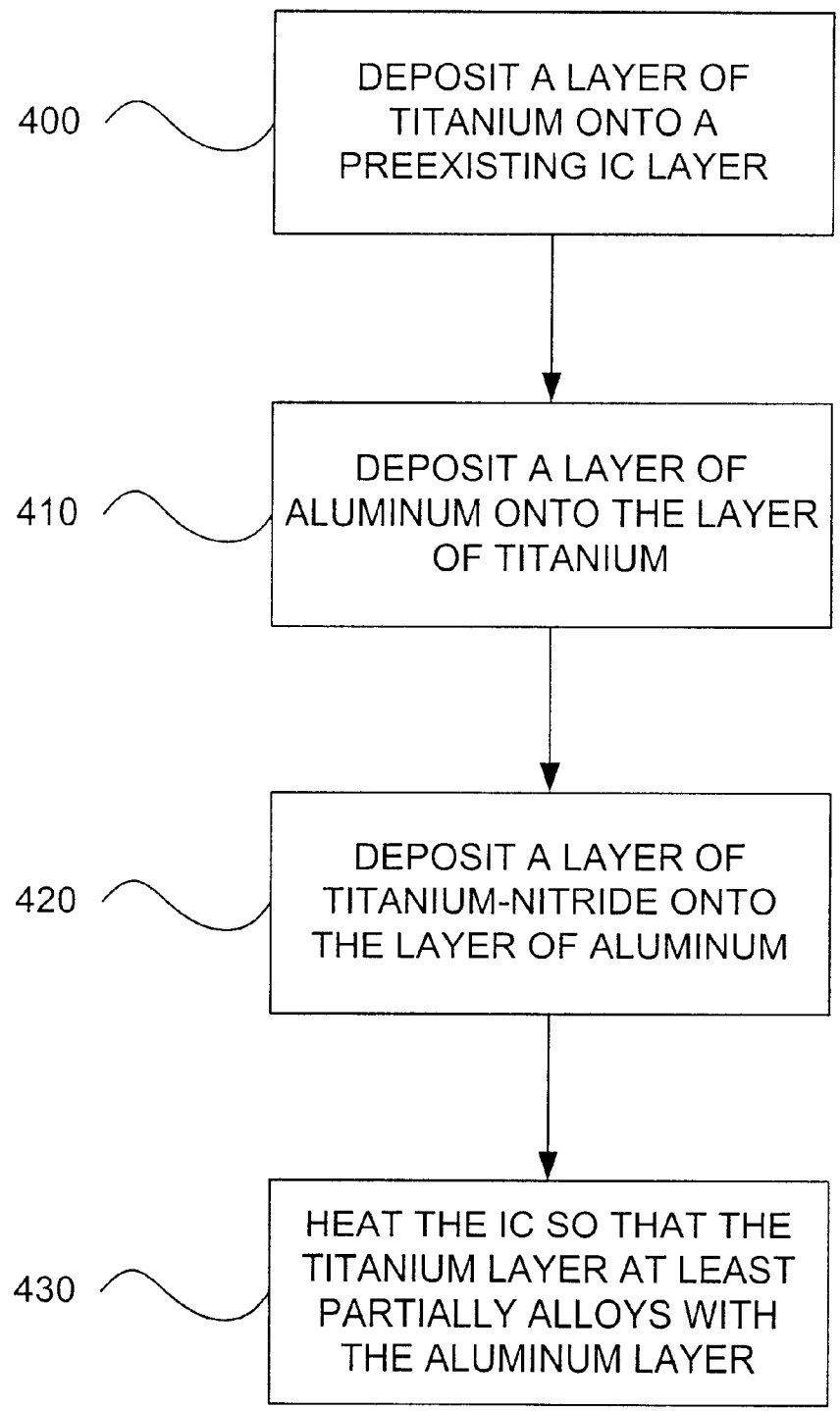
FIG. 4 is a flow chart of a method of fabricating a metallization structure according to an embodiment of the invention.

Another embodiment of the invention is a method of constructing a metallization structure containing titanium that provides superior contact resistance and electromigration properties while at the same time allowing water, hydrogen, and oxygen trapped in the IC to passivate defects on the surface of a silicon wafer. The steps, shown in FIG. 4, begin with the deposition of a layer of titanium onto a preexisting layer during the fabrication of an IC (step 400). A layer of aluminum is then deposited over the titanium layer (step 410). In this embodiment, a layer of titanium-nitride is then deposited over the layer of aluminum (step 420). In other embodiments, the titanium-nitride layer may be omitted. Also, other materials, such as those mentioned earlier, may be used as a top cladding layer in place of the titanium-nitride layer. Thereafter, a heating process is applied to the Ti/Al/TiN metallization stack (step 430), resulting in the titanium layer at least partially alloying with the aluminum layer. The heating step may be a final anneal, which is a typical process employed in IC fabrication to help restore previous silicon crystal damage.

However, in other embodiments, other heating processes may be utilized to allow the alloying of the titanium and aluminum.

The thickness of the titanium layer is determined by the needs of the particular application. However, if restriction of the gettering properties of titanium is of primary concern, such as in the case of optoelectronic ICs, a thin titanium layer is warranted so that no pure titanium is present in the metallization stack after the heating process (step 430) is completed.

From the foregoing, it will be apparent that the invention provides a metallization structure that takes advantage of the electromigration and contact resistance properties of titanium, while simultaneously restricting the gettering properties of that metal. As a result, the water, hydrogen, and oxygen not gettered by the titanium are allowed to passivate structural defects that would otherwise cause an unwanted increase of leakage current in the IC.

What is claimed is:

1. An integrated circuit having a metallization structure, the metallization structure residing on a preexisting dielectric layer of the integrated circuit, the metallization structure comprising:

a layer of titanium residing on the preexisting layer; and a layer of aluminum residing on the layer of titanium, the layer of titanium being at least partially alloyed with the layer of aluminum, the integrated circuit being heated sufficiently at 400 degrees C. for about 45 minutes after formation of the metallization structure so that impurities from the dielectric layer have passivated structural defects within a silicon layer of the integrated circuit.

2. The integrated circuit of claim 1, wherein the layer of titanium is completely alloyed with the layer of aluminum.

3. The integrated circuit of claim 1, wherein the thickness of the layer of titanium as deposited is less than or equal to 200 angstroms.

4. The integrated circuit of claim 1, further comprising a layer of titanium-nitride residing on the layer of aluminum.

5. The integrated circuit of claim 1, wherein the integrated circuit is an optoelectronic integrated circuit having photodiodes.

* * * * *